US008664541B2

(12) United States Patent
Andresen et al.

(10) Patent No.: US 8,664,541 B2
(45) Date of Patent: Mar. 4, 2014

(54) MODIFIED 0402 FOOTPRINT FOR A PRINTED CIRCUIT BOARD ('PCB')

(75) Inventors: Mark E. Andresen, Cary, NC (US); William T. Byrne, Raleigh, NC (US); Leslie M. Garrett, Stem, NC (US); Paul D. Kangas, Raleigh, NC (US); Larry G. Pymento, Cary, NC (US); Wilson Velez, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 13/190,057

(22) Filed: Jul. 25, 2011

(65) Prior Publication Data

US 2013/0025927 A1    Jan. 31, 2013

(51) Int. Cl.
*H05K 1/11* (2006.01)

(52) U.S. Cl.
USPC ............ 174/267; 361/760; 361/767; 361/768

(58) Field of Classification Search
USPC ........................... 174/267; 361/766–768, 782
See application file for complete search history.

(56) References Cited

U.S. PATENT DOCUMENTS

| 5,406,458 | A | * | 4/1995 | Schutt ............................ 361/767 |
| 5,781,413 | A | * | 7/1998 | Howell et al. ................... 361/777 |
| 6,020,562 | A | * | 2/2000 | Burns et al. .................... 174/261 |
| 6,271,481 | B1 | | 8/2001 | Goenka et al. |
| 7,064,450 | B1 | | 6/2006 | Eghan et al. |
| 7,084,353 | B1 | * | 8/2006 | Downes ......................... 174/261 |
| 7,292,450 | B2 | * | 11/2007 | Larsen et al. .................. 361/763 |
| 7,323,787 | B2 | * | 1/2008 | Chan ............................. 257/780 |
| 7,602,615 | B2 | | 10/2009 | Chan et al. |
| 7,645,940 | B2 | * | 1/2010 | Shepherd et al. ............. 174/250 |
| 7,738,259 | B2 | * | 6/2010 | Chan et al. .................... 361/777 |
| 7,906,835 | B2 | | 3/2011 | Romero |
| 7,916,495 | B2 | * | 3/2011 | Huang .......................... 361/767 |
| 8,273,994 | B2 | * | 9/2012 | Reynov et al. ................ 174/261 |
| 2006/0166398 | A1 | | 7/2006 | Chan |
| 2007/0130554 | A1 | | 6/2007 | Caruba |
| 2008/0205011 | A1 | | 8/2008 | Chan et al. |

FOREIGN PATENT DOCUMENTS

TW              403180 U   *  5/2011

OTHER PUBLICATIONS

"Decoupling capacitor".*

* cited by examiner

*Primary Examiner* — Hoa C Nguyen
*Assistant Examiner* — Amol Patel
(74) *Attorney, Agent, or Firm* — Edward J. Lenart; Katherine S. Brown; Biggers Kennedy Lenart Spraggins LLP

(57) ABSTRACT

A modified 0402 footprint for a PCB, including: at least two padstacks each having a minimum area consistent with the 0402 standard; and each padstack modified on at least two corners such that the padstack's footprint can be placed beneath a ball grid array ('BGA'), the BGA having approximately a 1 millimeter pitch, and such that the padstack may be placed at least at a minimum distance away from a closest via in the PCB, wherein each padstack has a trace to a via not directly under a padstack in the PCB and each padstack has no via within the padstack.

12 Claims, 3 Drawing Sheets

MODIFIED 0402 FOOTPRINT FOR A PRINTED CIRCUIT BOARD ('PCB')

BACKGROUND OF THE INVENTION

1. Field of the Invention

The field of the invention is data processing, or, more specifically, apparatus and products for a modified 0402 footprint for a printed circuit board ('PCB').

2. Description of Related Art

Modern computing components frequently make use of PCB technology. Modern PCBs can include a ball grid array for surface-mounting integrated circuits on the PCB. Modern PCBs can also include vias that run through the PCB. Faster edges, more sensitive devices, and higher clock rates demand good decoupling. The rule of thumb is use a minimum of one capacitor per power pin, placed as physically close to the power pins of the BGA as possible, to reduce inductance. Typical PCB manufacturing constraints restrict the placement of decoupling capacitors. Additionally, typical PCB manufacturing constraints limit the minimum diameter of vias. Due to their tight pin spacing, modern "chip-scale" or "micro-BGA" packages used for integrated circuit devices present unique challenges to PCB designers who need to incorporate decoupling capacitors into PCB designs using common, low cost PCB materials and processes.

SUMMARY OF THE INVENTION

A modified 0402 footprint for a PCB, including: at least two padstacks each having a minimum area consistent with the 0402 standard; and each padstack modified on at least two corners such that the padstack's footprint can be placed beneath a ball grid array ('BGA'), the BGA having approximately a 1 millimeter pitch, and such that the padstack may be placed at least at a minimum distance away from a closest via in the PCB, wherein each padstack has a trace to a via not directly under a padstack in the PCB and each padstack has no via within the padstack.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
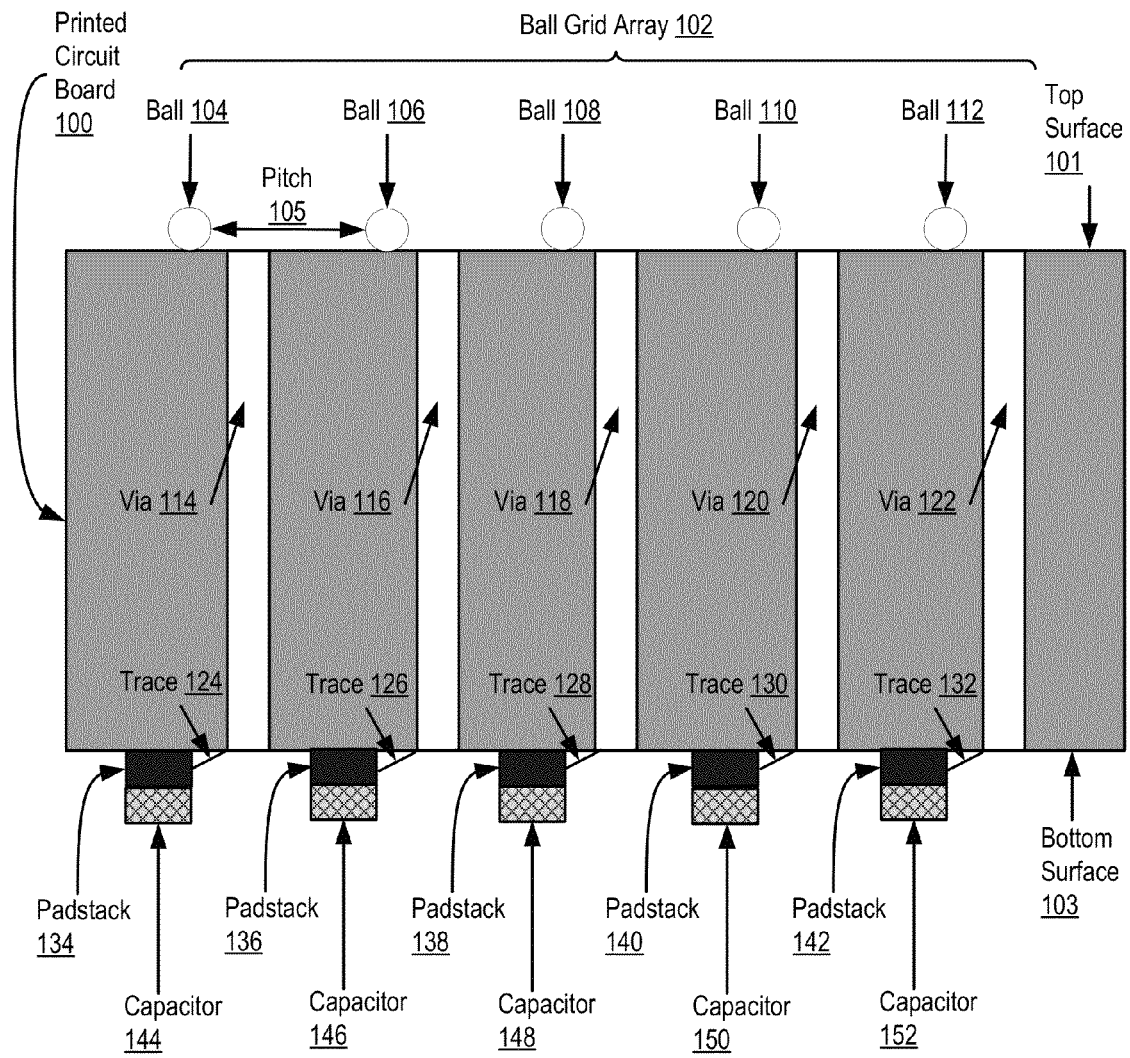
FIG. 1 sets forth a block diagram of a PCB according to embodiments of the present invention.

Exemplary apparatus and products for modified 0402 footprint for a PCB in accordance with the present invention are described with reference to the accompanying drawings, beginning with FIG. 1. FIG. 1 sets forth a block diagram of a PCB (100) according to embodiments of the present invention. The block diagram of FIG. 1 shows a side-view perspective of the PCB (100).

In the example of FIG. 1, the PCB (100) is a piece of computing equipment that mechanically supports and electrically couples computing devices. The PCB (100) can mechanically support and electrically couple computing devices through the use of mounting apparatus in which computing devices may be mounted, and conductive pathways such as tracks or signal traces that are etched onto a non-conductive substrate.

The example PCB of FIG. 1 includes a plurality of vias (114, 116, 118, 120, 122). Each via (114, 116, 118, 120, 122) represents a vertical electrical connection between computing devices on the top surface (101) and the bottom surface (103) of the PCB (100). In the example of FIG. 1, each via (114, 116, 118, 120, 122) may be formed by drilling a hole through the entire PCB (100) and plating the surface of the via with a conductive material, such that electrical signals can be sent between the surfaces (101, 103) of the PCB (100) via the conductive plating on the vias (114, 116, 118, 120, 122).

The example PCB of FIG. 1 includes a plurality of balls (104, 106, 108, 110, 112) that form a BGA (102) on the top surface (101) of the PCB (100). In the example of FIG. 1, the BGA (102) is a surface mount packaging used to mount a computing device such as, for example, a processor or other integrated circuit onto a PCB (100). The BGA (102) of FIG. 1 may be composed of a plurality of balls (104, 106, 108, 110, 112) that are arranged in a grid pattern. Each ball (104, 106, 108, 110, 112) may be embodied as a ball of solder or other conductive material that conducts electrical signals between a computing device coupled through the BGA (102) to the PCB (100). In the example of FIG. 1, each ball (104, 106, 108, 110, 112) is separated from other balls by a distance referred to hereafter as the 'pitch' (105).

In the example of FIG. 1, the plurality of balls (104, 106, 108, 110, 112) that form a BGA (102) on the top surface (101) of the PCB (100) are electrically coupled to the vias (114, 116, 118, 120, 122). The plurality of balls (104, 106, 108, 110, 112) that form a BGA (102) on the top surface (101) of the PCB (100) may be electrically coupled to the vias (114, 116, 118, 120, 122), for example, via a trace or other conductive path on the top surface (101) of the PCB (100) that runs between balls (104, 106, 108, 110, 112) that form a BGA (102) on the top surface (101) of the PCB (100) and the vias (114, 116, 118, 120, 122).

The example PCB (100) of FIG. 1 also includes plurality of padstacks (134, 136, 138, 140, 142) mounted on the bottom surface (103) of the PCB (100). In the example of FIG. 1, each padstack (134, 136, 138, 140, 142) represents a surface upon which a computing component may be mounted. Each padstack (134, 136, 138, 140, 142) may be embodied, for example, as a copper pour of a predetermined size and shape that connects a computing component such as a capacitor (144, 146, 148, 150, 152) to the PCB (100).

In the example PCB (100) of FIG. 1, each padstack (134, 136, 138, 140, 142) has a minimum area consistent with the 0402 standard. The 0402 standard, as the term is used here, is a package standard that controls the size of padstacks and the devices that can be mounted thereon. For example, capacitors that are compliant with the 0402 package are typically 0.41× 0.22 millimeters in size.

In the example PCB (100) of FIG. 1, each padstack (134, 136, 138, 140, 142) is connected to a via (114, 116, 118, 120, 122) by a trace (124, 126, 128, 130, 132) that runs between a padstack (134, 136, 138, 140, 142) and a via (114, 116, 118, 120, 122). Because each padstack (134, 136, 138, 140, 142) is also connected to a capacitor (144, 146, 148, 150, 152), the padstacks (134, 136, 138, 140, 142) and traces (124, 126, 128, 130, 132) therefore connect a capacitor (144, 146, 148, 150, 152) to a via (114, 116, 118, 120, 122). In the example PCB (100) of FIG. 1, each capacitor (144, 146, 148, 150, 152) that is connected to a via (114, 116, 118, 120, 122) may be embodied as a decoupling capacitor. A decoupling capacitor is a capacitor used to decouple one part of an electrical circuit from another part of the electrical circuit.

In the example PCB (100) of FIG. 1, each padstack (134, 136, 138, 140, 142) is modified on at least two corners such that the footprint of the padstack (134, 136, 138, 140, 142) can be placed beneath a BGA having approximately a 1 millimeter pitch and such that at least one modified corner of each padstack (134, 136, 138, 140, 142) may be placed at least at a minimum distance to a closest via (114, 116, 118, 120, 122) in the PCB (100). In the example of FIG. 1, the pitch (105) of the BGA (102) may be approximately 1 millimeter. For example, the pitch (105) of the BGA (102) may be within a range of 0.9-1.1 millimeters. In the example PCB (100) of FIG. 1, modifying at least two corners of the footprint of the padstack (134, 136, 138, 140, 142) can be carried out, for example, by etching off two of the corners of the padstack (134, 136, 138, 140, 142) as described in greater detail with reference to FIG. 3A and FIG. 3B.

In the example PCB (100) of FIG. 1, each padstack (134, 136, 138, 140, 142) includes no via. A via through one of the padstacks (134, 136, 138, 140, 142) would represent a vertical electrical connection between computing devices on the top surface of the padstacks (134, 136, 138, 140, 142) and the bottom surface of the padstacks (134, 136, 138, 140, 142). A via through one of the padstacks (134, 136, 138, 140, 142) could therefore be configured to provide a vertical electrical connection between the PCB (100) and a capacitor (144, 146, 148, 150, 152). In the example of FIG. 1, however, each padstack (134, 136, 138, 140, 142) includes no via as an electrical connection between the PCB (100) and a capacitor (144, 146, 148, 150, 152) is established through the use of a trace (124, 126, 128, 130, 132) that runs between a padstack (134, 136, 138, 140, 142) and a via (114, 116, 118, 120, 122) of the PCB (100).

Figure 2:
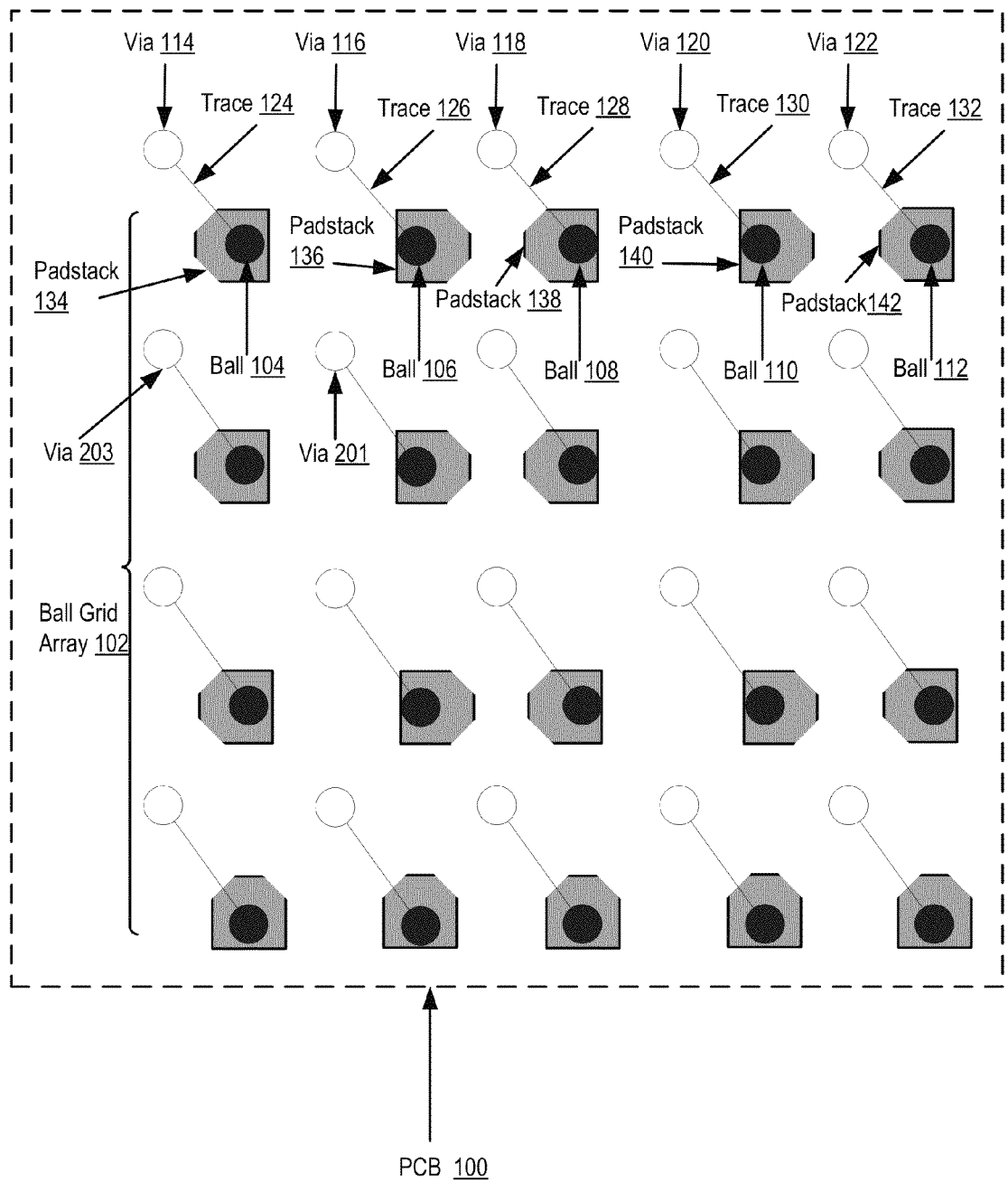
FIG. 2 sets forth a block diagram of a PCB according to embodiments of the present invention.

For further explanation, FIG. 2 sets forth a block diagram of a PCB (100) according to embodiments of the present invention. In particular, FIG. 2 depicts a top view of the PCB (100) whereas FIG. 1 represented a side view of the PCB (100). The PCB (100) of FIG. 2 includes a plurality of vias (114, 116, 118, 120, 122) that run through PCB (100). That is, each via (114, 116, 118, 120, 122) consists of an opening on the top surface of the PCB (100) and an opening on the bottom surface of the PCB (100), with a plated surface that runs between the opening on the top surface of the PCB (100) and an opening on the bottom surface of the PCB (100).

The example PCB (100) of FIG. 2 also includes a plurality of balls (104, 106, 108, 110, 112) that form a BGA. Each ball (104, 106, 108, 110, 112) resides on the top surface of the PCB (100). The plurality of balls (104, 106, 108, 110, 112) that form a BGA on the top surface of the PCB (100) may be electrically coupled to the vias (114, 116, 118, 120, 122), for example, via a trace or other conductive path on the top surface of the PCB (100) that runs between the balls (104, 106, 108, 110, 112) that form a BGA on the top surface of the PCB (100) and the opening of each via (114, 116, 118, 120, 122) on the top surface of the PCB (100).

The example PCB (100) of FIG. 2 also includes a plurality of padstacks (134, 136, 138, 140, 142) that reside on the bottom surface of the PCB (100). Although the example of FIG. 2 is a two-dimensional drawing, readers will understand that padstacks (134, 136, 138, 140, 142) of FIG. 2 reside on the bottom surface of the PCB (100) while the balls (104, 106, 108, 110, 112) of FIG. 2 reside on the top surface of the PCB (100), while the vias (114, 116, 118, 120, 122) run through the entire depth of the PCB (100), from the top surface of the PCB (100) to the bottom surface of the PCB (100).

In the example of FIG. 2, each padstack (134, 136, 138, 140, 142) is connected to a via (114, 116, 118, 120, 122) by a trace that resides on the bottom surface of the PCB (100). In the example of FIG. 2, each padstack (134, 136, 138, 140, 142) is modified on at least two corners such that the footprint of the padstack (134, 136, 138, 140, 142) can be placed beneath a BGA having a 1 millimeter pitch and such that at least one modified corner of each padstack (134, 136, 138, 140, 142) may be placed at least at a minimum distance to a closest via (114, 116, 118, 120, 122) in the PCB (100).

In the example PCB (100) of FIG. 2, modifying at least two corners of the footprint of the padstack (134, 136, 138, 140, 142) can be carried out, for example, by shaving off two of the corners of the padstack (134, 136, 138, 140, 142). For example, the padstack (134) in the upper left corner of FIG. 2 has its upper left and lower left corners shaved off. By shaving off these corners of the padstack (134), the padstack (134) may be placed at a position on the bottom surface of the PCB (100) that is not directly underneath the ball (104) on the top surface of the PCB (100). As illustrated in FIG. 2, the center of the padstack (134) is to the left of the center of the ball (104), such that the upper right corner and lower right corner of the padstack (134) are further away from the closest vias (116, 201) than would be possible if the center of the padstack (134) was directly underneath the center of the ball (104). Because the upper left corner and lower left corner have been modified, the upper left corner and lower left corner can still be a required distance away from the vias (114, 203) that are closest to the modified corners of the padstack (134) in spite of the fact that the padstack (134) is shifted to the left of the center of the ball (104) on the other side of the PCB (100).

Figure 3A:
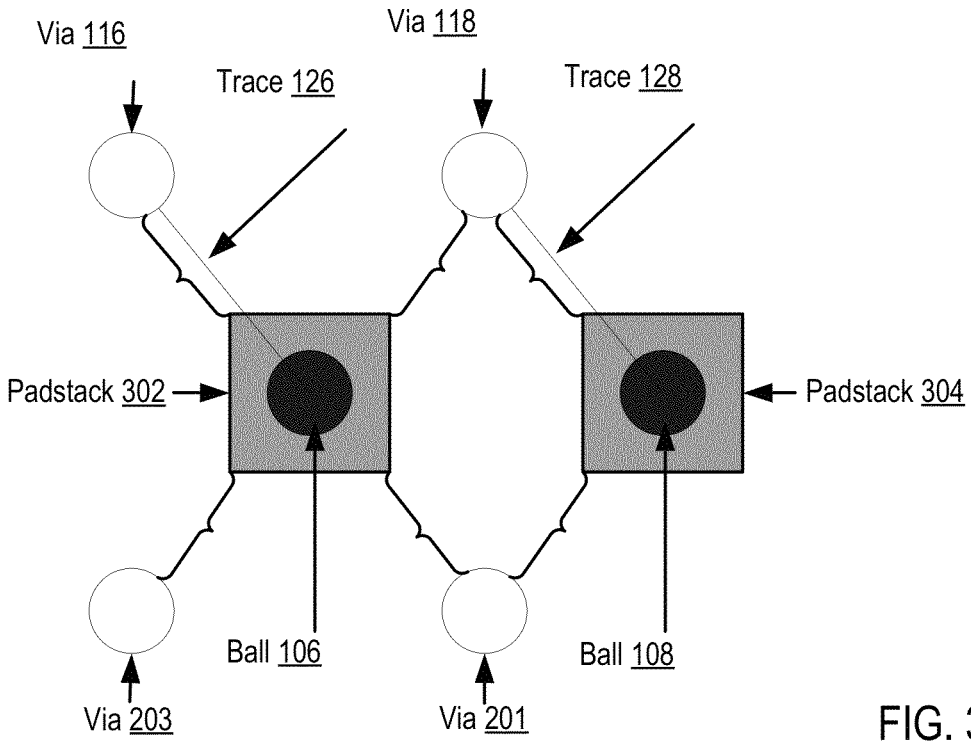
FIG. 3A sets forth a block diagram of an unmodified pad.
Figure 3B:
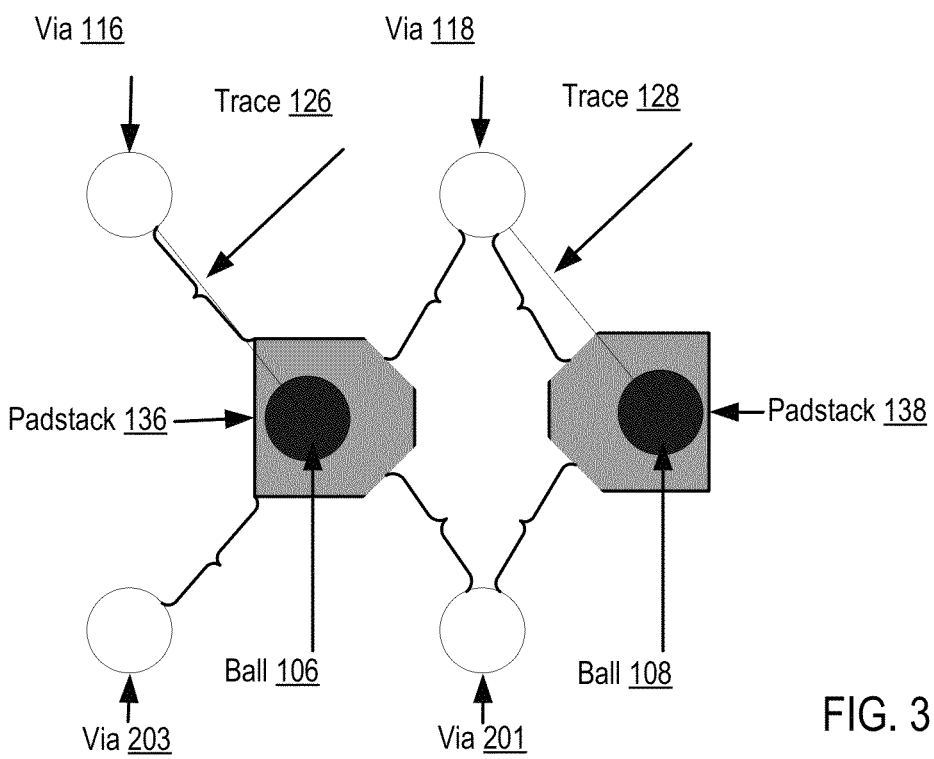
FIG. 3B sets forth a block diagram of a modified padstack according to embodiments of the present invention.

For further explanation, FIG. 3A and FIG. 3B illustrate distinctions between standard padstacks and the modified padstacks set forth in embodiments of the present invention. FIG. 3A illustrates two padstacks (302, 304) without any modified corners. Each padstack (302, 304) in FIG. 3A is placed directly underneath a ball (106, 108) that would reside on the opposite side of a PCB as the padstacks (302, 304). As such, each corner of each padstack (302, 304) would be a particular distance away from a particular via (116, 118, 201, 203), as illustrated by the brackets included in FIG. 3A.

FIG. 3B illustrates two modified padstacks (136, 138) according to embodiments of the present invention. Each padstack (136, 138) in FIG. 3B is not placed directly underneath a ball (106, 108) that would reside on the opposite side of a PCB as the padstacks (136, 138)). As such, the distance between the unmodified corners and the closet via (116, 203) can be increased by simply shifting the entire padstack (136) away from each via (116, 203). The distance between the modified corners of each padstack (136, 138) and the closest vias (118, 201) can also be increased, relative to an unmodified pad, by the geometry of the corners themselves.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A modified 0402 footprint for a printed circuit board ('PCB') comprising:
   at least two padstacks each having a minimum area consistent with the 0402 standard; and each padstack, having two modified corners and two unmodified corners, each modified corner modified such that the padstack's footprint can be placed beneath a ball grid array ('BGA'), the BGA having approximately a 1 millimeter pitch, and such that the padstack may be placed at least at a minimum distance away from a closest via in the PCB, wherein each padstack has a trace to a via not directly under a padstack in the PCB and each padstack has no via within the padstack;

wherein each padstack is placed in an offset position underneath a ball that resides on the opposite side of the PCB as the padstacks such that the ball is closer to the unmodified corners of the padstack than the modified corners of the padstack.

2. The modified 0402 footprint for a PCB of claim 1 wherein each modified corner of each padstack is at least 0.45 millimeters away all vias in the PCB.

3. The modified 0402 footprint for a PCB of claim 1 wherein each modified corner has at least 0.1 millimeters of each side that formed the original corner removed.

4. The modified 0402 footprint for a PCB of claim 1 wherein each padstack is separated by at least 0.3 millimeters.

5. The modified 0402 footprint for a PCB of claim 1 wherein approximately a 1 millimeter pitch further comprises a pitch within the range 0.9-1.1 millimeters.

6. The modified 0402 footprint for a PCB of claim 1 wherein approximately a 1 millimeter pitch further comprises a 1 millimeter pitch.

7. A printed circuit board ('PCB') comprising:
a ball grid array ('BGA') having a particular pitch;
a plurality of vias from the balls of the ball grid array through the PCB;
a plurality of capacitors, each capacitor offset from the vias on the bottom of the PCB, wherein each capacitor is connected to a via by a trace and each capacitor is shaped such that the length of the trace is at least a threshold length required by the pitch and width of the vias; and
a plurality of padstacks, each padstack coupled to a capacitor, each padstack having two modified corners and two unmodified corners, each modified corner modified such that the padstack can be placed beneath the BGA such that the padstack may be placed at least at a minimum distance away from a closest via in the PCB, wherein each padstack has a trace to a via not directly under a padstack in the PCB and each padstack has no via within the padstack; wherein each padstack is placed in an offset position underneath a ball that resides on the opposite side of the PCB as the padstacks such that the ball is closer to the unmodified corners of the padstack than the modified corners of the padstack.

8. The PCB of claim 7 wherein the particular pitch is within a range of 0.9-1.1 millimeters.

9. The PCB of claim 7 wherein the particular pitch is 1 millimeter.

10. The PCB of claim 7 wherein the threshold length is within a range of 0.4-0.5 millimeters.

11. The PCB of claim 7 wherein the threshold length is 0.45 millimeters.

12. The PCB of claim 7 wherein the capacitors are decoupling capacitors.

* * * * *